United States Patent
Zhu et al.

(10) Patent No.: US 6,177,795 B1
(45) Date of Patent: Jan. 23, 2001

(54) SPECTRAL COMPONENT IMAGING USING PHASED ARRAY COILS

(75) Inventors: Gang Gary Zhu; Jian Huang; Hari Hariharan; Stephen J. Freeland, all of Fort Collins, CO (US)

(73) Assignee: Elscint Ltd., Haifa (IL)

( * ) Notice: Under 35 U.S.C. 154(b), the term of this patent shall be extended for 0 days.

(21) Appl. No.: 09/080,920

(22) Filed: May 19, 1998

(51) Int. Cl.[7] ................................................ G01V 3/00
(52) U.S. Cl. ............................... 324/307; 324/309
(58) Field of Search .................................. 324/307, 309, 324/310, 312, 314, 300

(56) References Cited

U.S. PATENT DOCUMENTS

| | | | |
|---|---|---|---|
| 4,871,967 | * 10/1989 | Rotem et al. | 324/309 |
| 5,225,781 | * 7/1993 | Glover et al. | 324/307 |
| 5,701,074 | 12/1997 | Zhu | 324/307 |
| 6,016,057 | * 1/2000 | Ma | 324/309 |

OTHER PUBLICATIONS

"Simple Proton Spectroscopic Imaging", By W. T. Dixon, Journal of Radiology, vol. 153, pp. 189–194 (1984).
"General Three Point Water Fat Imaging with Optimized SNR", by Quing–San Xiang et al. ISMRM, p. 1544 (1996).
"Two–Point Dixon Technique for Water–Fat Signal Decomposition with B0 Inhomogeneity Corrections", byy Bernard D. Coombs, Jerry Szumowski, William Coshow and Fang Li, ISRM, p. 647, (1995).*

* cited by examiner

*Primary Examiner*—Louis Arana
(74) *Attorney, Agent, or Firm*—Hoffman, Wasson & Gitler, PC

(57) ABSTRACT

A method of using magnetic resonance imaging (MRI) systems for acquiring separate data contributions in images of subjects derived from at least a first and a second spectral components, the method comprising:
  applying RF pulses;
  receiving RF signals with a phased array coil arrangement having a plurality of segments;
  acquiring two initial complex images, the first of the two initial images being a complex image of each of the spectral components in phase; the second of the two initial images being a complex image of each of the spectral components out of phase, the first of said two initial complex images ostensibly being a plus image, and the second of said two complex images ostensibly being a minus image initially; and
  matching the ostensible plus and minus images so that the first complex images and the second complex images are grouped together for further processing. Preferably, a two-point Dixon method is used to generate the components.

27 Claims, 6 Drawing Sheets

SPECTRAL COMPONENT IMAGING USING PHASED ARRAY COILS

FIELD OF THE INVENTION

This invention is concerned with magnetic resonance imaging (MRI) systems and more particularly with the use of such systems to obtain separate images of different spectral components such as water and lipids. This application is an improvement over the patent application Ser. No. 08/639,330 filed on Apr. 25, 1996 now U.S. Pat. No. 5,701,074. That patent is assigned to the assignee of this invention and is hereby incorporated herein by reference.

BACKGROUND OF THE INVENTION

An article by W. T. Dixon vol. 153 pp. 189–194 appearing in the journal Radiology entitled "Simple Proton Spectroscopic Imaging" gave the initial impetus to the procedures used for the separation of spectral components in MRI imaging. That article explained the method of encoding spectroscopic information into clinical images. The initial Dixon method has subsequently been improved upon as explained in a plethora of patents and articles. Some of the patents are listed in the above mentioned patent.

The images differentiating between water and fat intensities in the basic Dixon method of the prior art were produced using a spin echo sequence in which the spin echo and a gradient echo coincide. In addition, each excitation was repeated with the spin echo shifted by an appropriate interval. More particularly the 180° RF pulse was shifted by a time T to shift the spin echo with respect to the gradient echo an amount sufficient to cause the chemical shift between the echoes of water and lipids to be 180° out of phase at the gradient echo time. The image produced with the described sequence clearly indicates the differences between the signals due to water and the signals due to fat.

A major problem with the original Dixon method is its susceptibility to main field inhomogeneity. In the past, several improved water and fat separated imaging methods have been developed to obtain water images and fat images in one scan. They can be classified in two major categories:
1. The two point method of the previously mentioned patent, and
2. The general three point method developed by Qing-San Xiang et al published in ISMRM pg. 1544 (1996) entitled "General Three Point Water Fat Imaging with Optimized SNR", the disclosure of which is incorporated herein by reference.

The data acquisition time of the general three point method is about three times longer than the normal scan. The data processing time of the general three point method is on the order of 10–20 seconds for a 256×256 pixel image. The data acquisition time of the two point Dixon method disclosed in the above mentioned patent is only two times longer than a normal scan and the data processing time is 1–2 seconds for a 256×256 pixel image.

The improvements of two times versus three times the scan time and the reduction of the processing time from 10–20 to 1–2 seconds per image clearly is a vast improvement that makes the two point Dixon method the method of choice for clinical use. However, until now the two point Dixon method had limitations which proscribed its use in certain situations.

For example, it has not been used for phased array coil images. Phased array coils comprise a plurality of individual coils herein referred to as "segments". With such arrangements it is necessary to separate the water and fat images obtained from each of the different segments of the phased array coil arrangement and to separately combine all of the water images of each of the segments and to separately combine all of the fat images of each of the segments.

It is known that in addition to the images, the phase distortion caused by inhomogeneity of the main field Bo can be determined from the two scans that came from the original Dixon method. See for example the article by Coombs, BD et al in SMRM, pg. 647 (1995), the disclosure of which is incorporated herein by reference.

In addition to the inhomogeneity problem, another problem solved by the method of the above mentioned patent application is the required phase unwrapping. Unwrapping methods prior to the above mentioned patent were tedious, non-robust and unreliable when phase wrapping was present which was most of the time. The above mentioned patent presents a method of overcoming the phase unwrapping problem.

An improvement provided by some preferred embodiments of the invention herein is, among other things, to use the method of the patent successfully with phased array coil arrangements and more particularly to provide a system that separately combines the water images from the different segments and the fat images from the different segments of a phased array coil arrangement speedily and reliably and/or which is immune to field inhomogeneity for practical purposes.

In spectral imaging using whole body coils there is really no need to determine which of the two images obtained is a fat image and which is a water image. The person doing the scan can easily determine this based on the appearance of the image. However, when using phased array coils it is necessary to combine all of the images of one spectral component separately and all of the images of the other spectral component separately. Thus while it is not necessary to determine which data comprise the fat images and which data comprise the water images; it is necessary to keep the two types of data separated. Like data are then combined to form the two spectral images.

The two point Dixon method described in the above named patent did not match the data; instead it used a histogram method for differentiating between fat images and water images. Since it was not necessary to actually determine which images are fat and which images are water in the two point Dixon method of the patent, it was not necessary to use any method for determining which are the fat and which are the water images. Rather it was necessary to determine which data match together, i.e. are either from a first or a second spectral component.

Accordingly, a broad aspect of some preferred embodiments of the present invention is to provide a method and system for separating spectral images during the production of the different spectral images while utilizing a phased array coil arrangement for obtaining the image data.

Accordingly, it is another object of some preferred embodiments of the present invention to acquire separate data contributions from first and second spectral components, for correcting the data for the phase wrapping that is due to the inhomogeneity of fields within the sample, as well as due to linear phase delays in a robust, reliable, repeatable and relatively simple manner.

SUMMARY OF THE INVENTION

In accordance with some preferred embodiments of the invention, data may be acquired in sufficient quantities to construct an image of each of the spectral components without determining which spectral component is which, and for differentiating data of the first spectral component from data of the second spectral component by determining matching data. The spectral component images are preferably acquired using the two point Dixon method. However, other methods of acquiring spectral component images may be used in some preferred embodiments of the invention.

The invention, in some preferred embodiments thereof, improves on the two point Dixon method of U.S. Pat. No. 5,701,074 by providing for accurately matching the acquired data that provides images of one spectral component, such as water and separately accurately matching the acquired data of a second spectral component such as fat to enable acquiring water only or fat only images using phased array coil arrangements.

In accordance with a preferred embodiment of the present invention, a method of using Magnetic Resonance Imaging (MRI) systems for acquiring and accumulating separate data contributions for images derived from first and second spectral components is provided, the method comprises:

applying RF pulses with a whole body coil and receiving RF signals with a phased array coil arrangement using a two point Dixon method;

each segment of the phased array coil arrangement acquiring data for two initial complex images;

one of said two initial complex images being first assigned as a plus image representing one spectral component and the other of said two initial complex images being first assigned as a minus image representing the other spectral component; and matching the data of the plus and minus images separately so that the image data for each of the two spectral components are separately grouped together for subsequent processing.

In a preferred embodiment of the invention, matching the data includes determining whether the plus or minus images which ostensibly represent each of a first and a second component are indeed representative of those components, or whether they should really represent the other component.

Alternatively or additionally, data matching further comprises "swapping" the images by changing the image data designations from plus to minus and vice versa when it is determined that the images actually are of the other components.

Alternatively or additionally, the method includes obtaining plus images and minus images during unwrapping and in determining which images designated as plus and minus images are truly plus and minus images. In greater detail any plus image or minus image that includes a $2(2n-1)\pi$ factor, where n is an integer, in the unwrapped phase map is given the opposite sign, for data matching purposes. An apparent "plus" image that includes a $2(2n-1)$ factor is the corresponding "minus" image.

A related feature of some preferred embodiments of the invention comprises obtaining combined images of the two spectral components by recombination of the truly plus complex images from all segments as the resultant plus complex image and by recombination of the truly minus complex images from all segments as the resultant minus images.

BRIEF DESCRIPTION OF THE DRAWINGS

The above listed and other objects and features of the present invention will be best understood when considered in light of the following description of a broad aspect of the present invention taken in conjunction with the accompanying drawings, wherein.

DETAILED DESCRIPTION OF THE PREFERRED EMBODIMENTS

Figure 1:
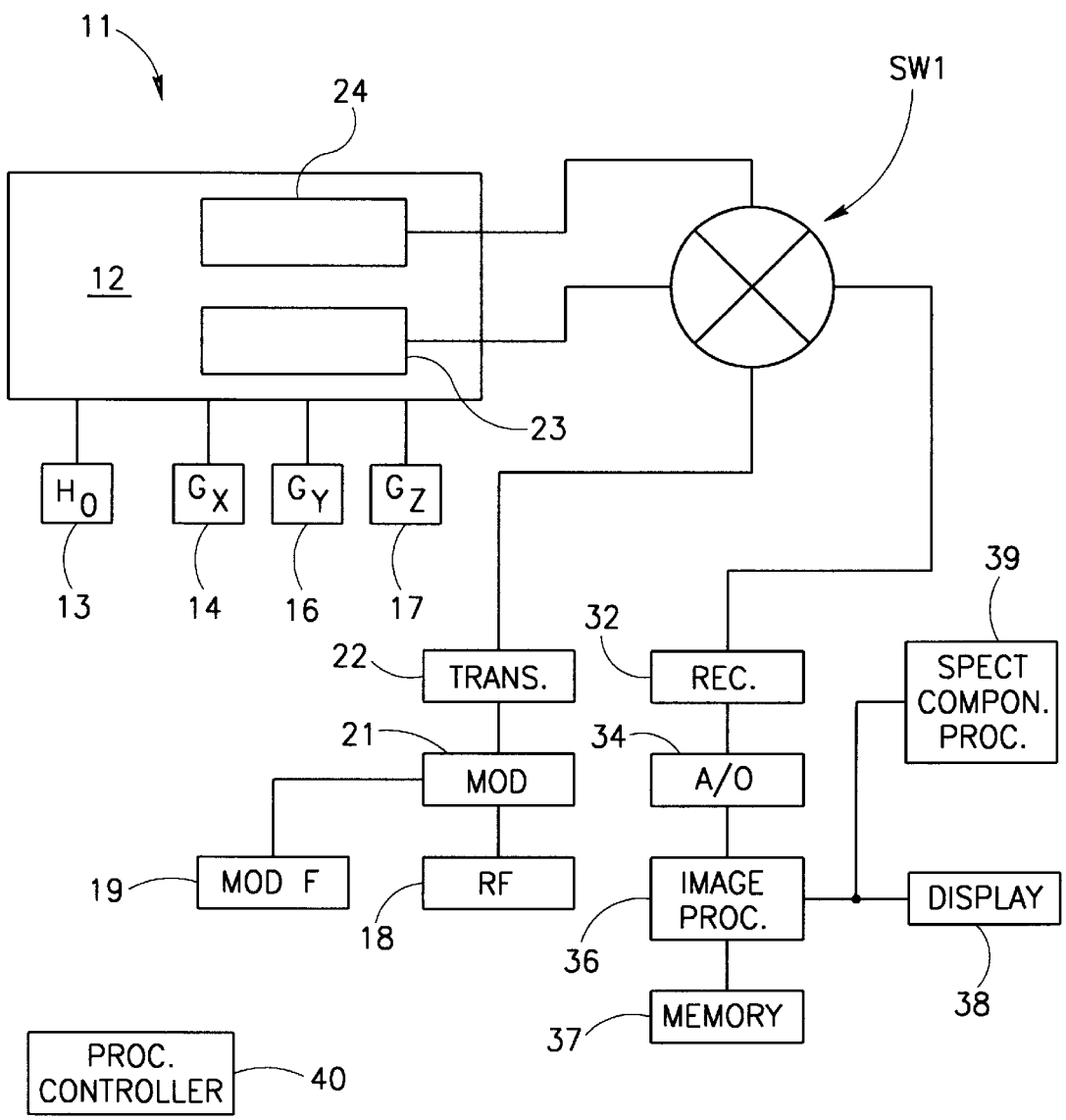
FIG. 1 is a block diagram showing of a magnetic resonance data acquisition system using a whole body coil for RF excitation and a phased array coil arrangement for RF reception.

FIG. 1 generally shows an MRI system 11 for use in acquiring data and providing images using magnetic resonance principles. The system includes a large static magnet 12 into which a patient (or sample) is placed. The static magnetic field can be generated using electro magnets, permanent magnets or super-conducting magnets within the scope of this invention. In a preferred embodiment a super-conducting magnet is used.

Gradient fields are preferably provided for locating the source of signals received in the MRI system. More particularly, gradient fields are applied to the static magnetic field Bo generated by Ho. These gradients are applied in X, Y and Z orthogonal coordinate directions. Gradient generators are indicated at blocks 14, 16 and 17 labeled GX, GY and GZ, respectively. The gradients are used to vary the magnetic fields along the X, Y and Z axes and thus provide slice selection, phase encoding and read-out or view selection functions.

The large static magnetic field causes an alignment of certain nuclear spins in the sample (or patient). Means are provided subsequently for tipping or perturbing the aligned spins by applying radio-frequency (RF) pulses at the Larmor frequency of the particular nuclei being perturbed or nutated.

The RF pulses are preferably generated in the RF generator 18. The pulses may be shaped by modulating them with shaped signals generated at modulation signal generator 19. The shaped signals and the RF pulses are applied to a modulator 21. The modulated shaped RF pulses arc then transmitted by a transmitter amplifier 22 through a whole body coil 23.

The receiving channel in FIG. 1 (reference numbers 32 etc.) is an abbreviated showing. Therein only a single channel is depicted. In actuality there is preferably a receiving channel for each segment of the phased array coil arrangement.

Figure 2:
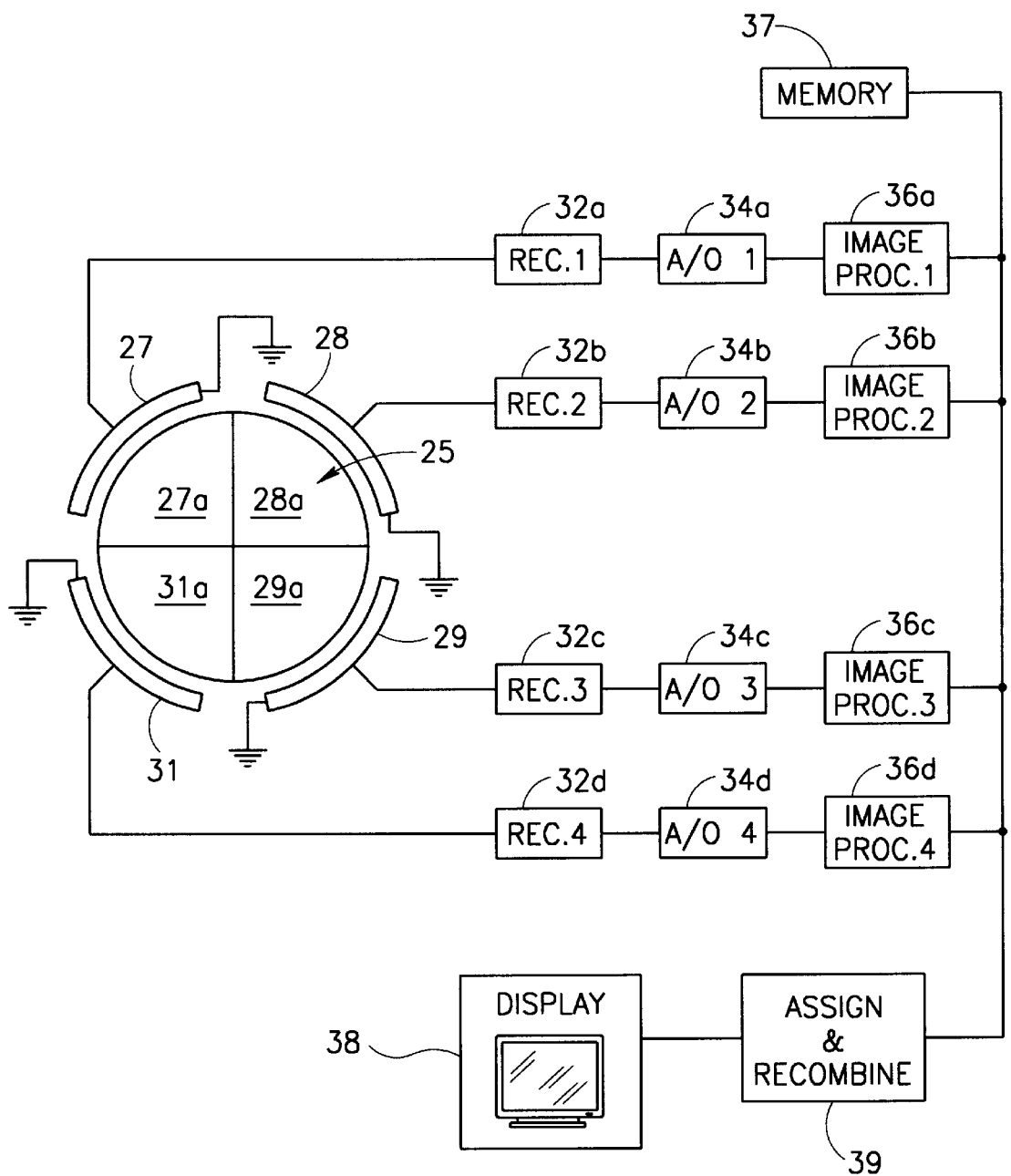
FIG. 2 shows the phased array coil arrangement positioned to scan a subject.

The phased array coil arrangement is best seen in the front sectional view of FIG. 2. Therein a phased array coil arrangement is shown that is comprised of four separate segments, seen as separate segments 27, 28, 29 and 31. However, in other preferred embodiments of the invention, a different number of coils, such as 2, 3, 5, 6, 7 or even more coils may be used. Preferably, a plurality of these segment coils generate signals which contribute to an individual slice. These segments are preferably arrayed around a patient indicated at 25. Each of the segments preferably acquires data for images of the complete cross section of the patient but practically each segment best images the portions 27a, 28a, 29a and 31a in detail. In some cases, only a partial cross-section of the patient is imaged.

Thus to obtain better images of the patient, all of the spectral components of each of the molecules being imaged by each of the coils must be combined together. Thus, it is necessary to match like spectral component data. For example, it is not necessary to know actually which are the water components and which are lipid components. It is only necessary to be able to match the lipid components and to match the water components.

The phased array coil arrangement is used in the receiving mode and the segments are simultaneously but preferably separately read out. In some preferred embodiments of the invention, signals from one or more of the segments may be acquired separately, preferably using the same signal parameters and timings, possibly using the same receiving circuits. As shown each segment is connected to its own receiver and an A/D converter to read out an in-phase and an out-of-phase image. More particularly receivers 32a, 32b, 32c and 32d respectively are shown. The outputs of the receivers are each connected to its associated analog to digital converter, 34a, 34b, 34c and 34d respectively. The outputs of each of the A/D converters, i.e. data for initial in-phase complex images and out-of-phase complex images are connected to the image processors 36a, 36b, 36c and 36d, respectively. The processors each provide both "plus" and "minus" processed complex images. The memory 37 interacts with each of the image processors. The four pairs of images are supplied to the common spectral component processor 39 to determine and combine the real plus and real minus images. The display 38 then displays the combined resultant complex images. In some preferred embodiments of the invention, the in-phase and out of phase images are acquired substantially during a same scan. However, in other preferred embodiments of the invention, an in-phase image may be acquired at a different time from an out-of phase image for the same segment. Preferably however, the different images are acquired under similar conditions.

Figure 3:
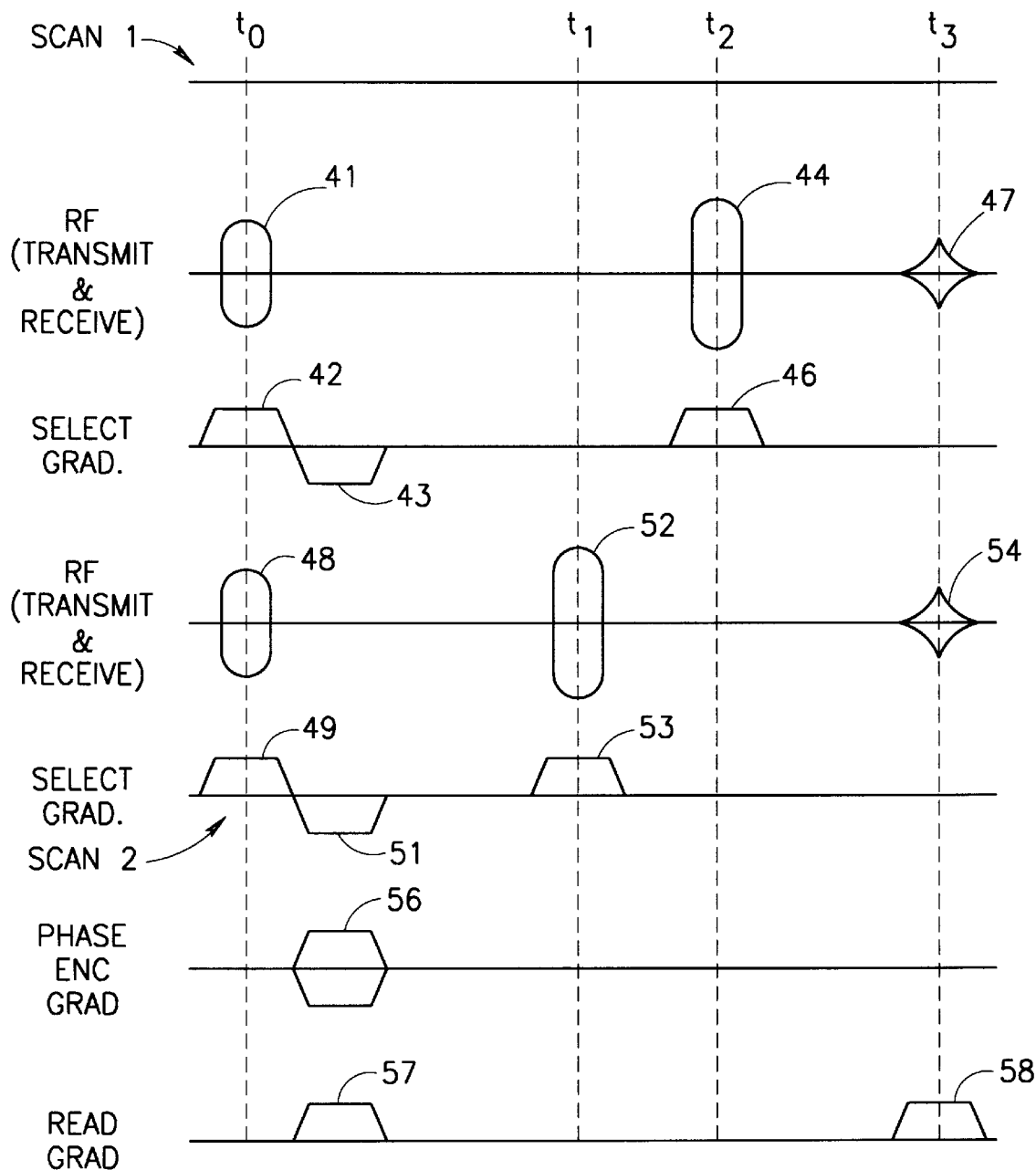
FIG. 3 shows a spin echo scan sequence applied to each of the coils of the phased array coil arrangement.

In spin echo sequences, such as depicted in FIG. 3, after passage of a set amount of time from the end of the first RF pulse, echo signals are generated. The echo signals, whether gradient echo signals or spin echo signals, are set to have appropriate phase differences between the spectral components. The echoes are received by the receivers 32a–32d of FIG. 2 using the phased array coil arrangement 24. The received signals pass through SW1 to the receivers 32.

The received RF signals representing the initial complex images are amplified and digitized by the analog-to-digital circuitry indicated at 34a–34d. The amplified, digitized signals are preferably processed in image processors 36a–36d in conjunction with memory means 37 to obtain pixel values for images on display monitor 38. A special spectral component processor 39 is provided to process the different spectral components to provide the data for the resultant complex images.

The data processing and acquisition of the system is preferably under the control of processor-controller 40. The processor-controller 40 provides the control signals and time sequences for the scan sequence used in acquiring data. Controller 40 preferably controls all the blocks shown and thus is connected to each of the blocks. To avoid confusion, the buses between the processor controller 40 and the other blocks are not shown.

When doing hydrogen nucleus (proton) imaging, for example, artifacts are often generated because of chemical shifts in the proton resonance. The chemical shifts are caused by differences in the resonant frequency of protons attached to different molecules. For example, water protons have a slightly different Larmor frequency than lipid protons. The differences in frequencies due to the chemical shifts produce spatial shifts which cause artifacts in the images. However, the chemical shift can also be used to obtain additional data such as, for example, data which quantifies the amount of fatty substances in body tissue and thus the additional data can be extremely useful.

FIG. 3 shows a spin echo scan sequence wherein data from both first and second spectral components and a Bo inhomogeneity phase map can be obtained using only one pair of scans. This is done by shifting the 180° RF pulse and the corresponding slice selective gradient by an amount sufficient to assure that the first and second spectral components are 180° out of phase. More particularly in FIG. 3 it is seen that the first 90° RF pulse 41 is applied at time "to" and during the application of a select gradient pulse 42. A re-phasing portion 43 of the select gradient pulse 42 is also used as shown. The second RF pulse 44, that is the 180° RF pulse, is applied at time "t2" during the application of the select gradient pulse 46. At time "t3" an echo is produced as shown at 47. The time "t3" is equal to twice the time "t2".

In a second scan, the 90° RF pulse 48 is applied at time "to" and during a select gradient pulse 49 having a re-phasing portion 51. In this scan, the 180° RF pulse 52 is shifted to be applied at time "t1". The time t2–t1 is preferably equal to 1.1 millisecond where the static magnetic field is 1.5 Tesla. In this scan, the echo is delayed after t1 by 2.2 milliseconds and the signals from the water and the fat are exactly out of phase.

FIG. 3 shows a select gradient 53 applied during the application of the 180° RF pulse 52. The echo 54 is in the same location at "t3" as the echo 47 because the re-phase gradient is not changed. FIG. 3 also shows a phase encoding pulses 56 and readout pulses 57 and 58 applied to both scans. Readout pulse 57 is applied prior to the 180° RF pulses so as to cause the out of phase spin echo to occur at the same time as the in phase spin echo. This is done, preferably, by assuring that the area under pulse 57 is equal to half the area under pulse 58.

In the first scan, signals from the first and second spectral components (such as water and fat) are in the same phase at the echo time t3. In the second scan the signals from the first and second spectral components (such as water and lipid) are 180° out of phase. Thus, the scan provides two spectral images S1 and S2. In image S1 the signals from the two different spectral components are in phase. In image S2, the signals from the two different spectral components are 180° out of phase. The image processors 36a–36d provide the initial complex images S1, S2 for each of the segments 27, 28, 29 and 31.

The sequence of FIG. 3 is merely shown as one exemplary sequence for obtaining spectral component images for two or more components. Within the scope of this invention other sequences can be used. The image processors 36a–36d in conjunction with processor 39 and memory 37 provides the resultant complex images S1 and S2 for each segment of the phased array coil arrangement.

Figure 4A:
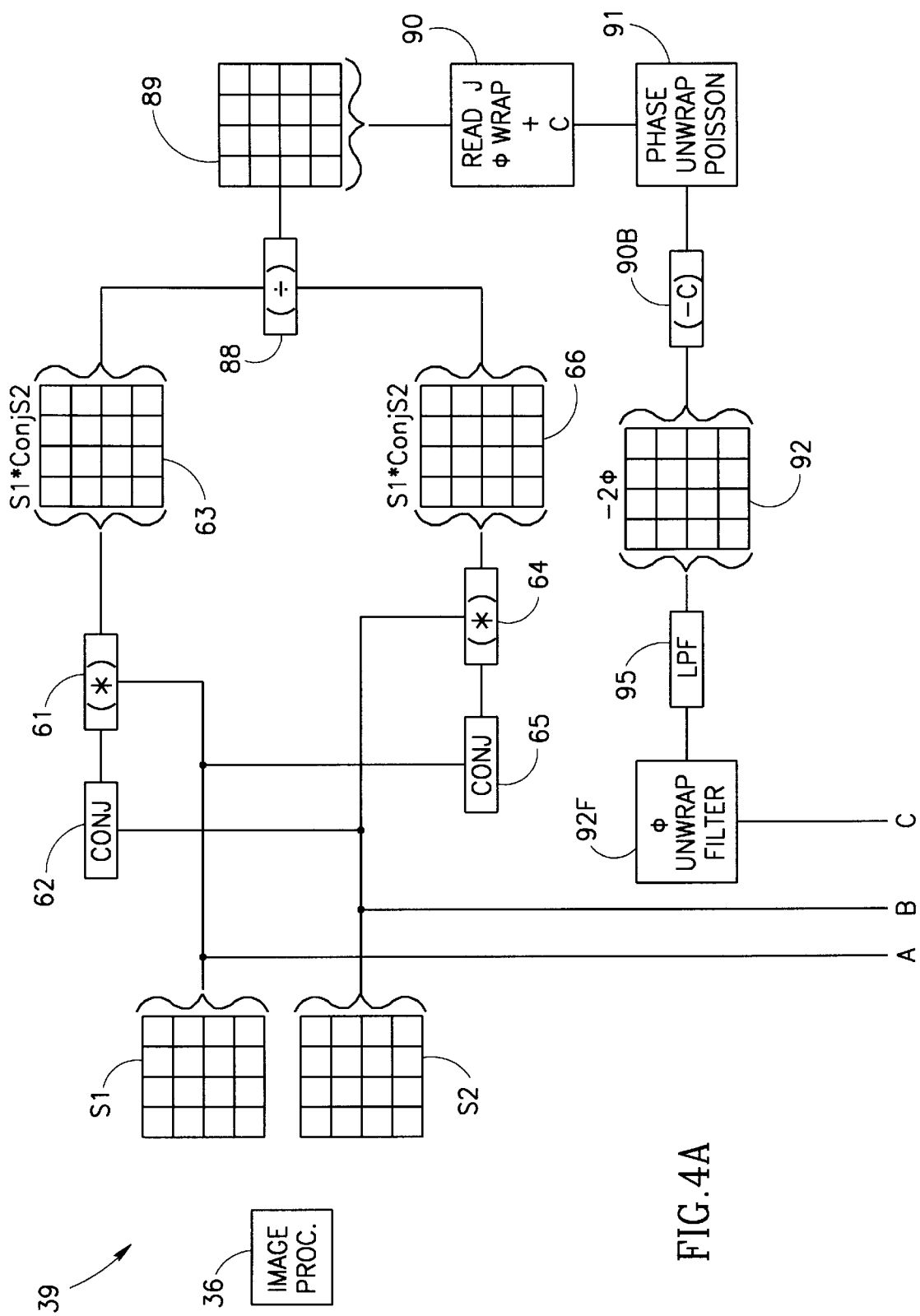
FIGS. 4A and 4B comprise a schematic showing of the processing of initial complex image data acquired by each of the segments of the phased array coil arrangement to provide the resultant plus and minus complex images.
Figure 4B:
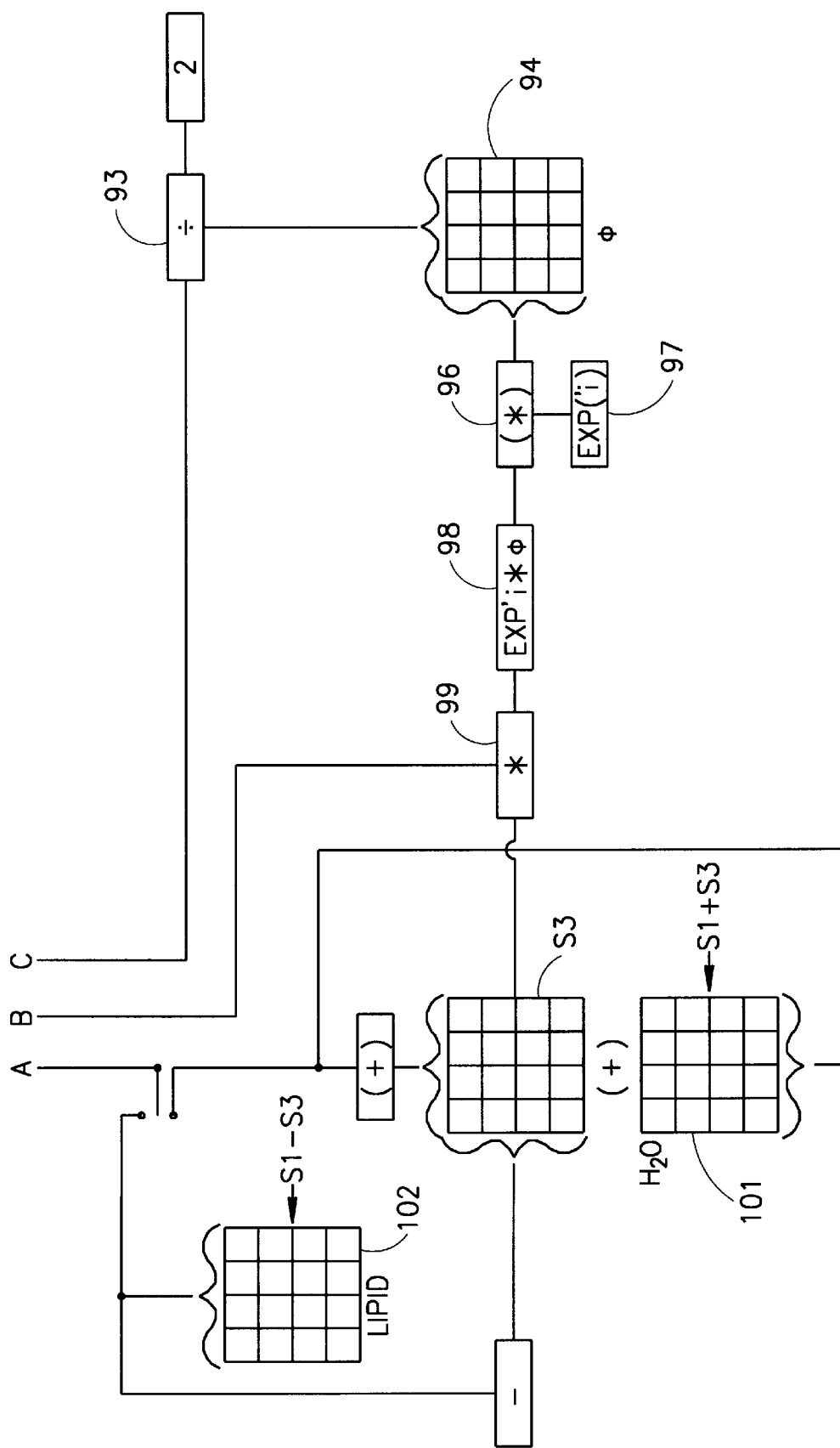

FIG. 4 (divided into FIGS. 4A and 4B, for convenience) is a block diagram showing of how the two initial complex images, S1 and S2, obtained from each segment of the phased array coil arrangement are used to provide the resultant complex images S1, S2 of the two separate spectral components. More particularly, the image processors represented in FIG. 4 by image processor 36 is shown as feeding into the spectral component processors represented by 39. The initial complex image S1 is convolved with the conjugate of initial complex image S2. Thus, the image S1 is shown as providing data to a convolver 61. At the same time, the conjugate of image S2 is provided by conjugator 62 to the convolver 61. A matrix 63 of image data S1* conjugate (S2) is provided. Similarly, the data from the image S2 is provided to a convolver 64; while, the conjugate of the image S1 is provided to convolver 64 by the conjugator 65. The convolver 64 thus convolves image data of image S2 with the conjugate of the image data of the image S1 to provide a matrix 66 of data for the image S2* conjugate (S1).

The S1*conjugate (S2) image is divided by the S2*conjugate (S1) image as shown by the division block 88. The quotient is the phase wrapped inhomogeneity phase map shown at 89.

Image 89 is unwrapped using the Poisson equation as indicated at block 91. The phase unwrapped map (−2φ) is indicated at block 92. It is divided by 2 at block 93 to provide the phase unwrapped map at 94. The phase unwrapped map of block 94 is convolved with the exponent (i) as indicated at blocks 96 and 97 to obtain the exponent (−i*φ) indicated at block 98. The exponent (−i*φ) is convolved with the S2 image as indicated at block 99 to provide an S3 image which is the phase corrected S2 image. The S3 image is then selectively added to the S1 image to provide a (+) plus image at 101 or is selectively subtracted from the S1 image to provide a (−) minus image at 102.

The plus and minus images are each ostensibly of a different spectral component. These images are subsequently tested to determine whether they are indeed (+) or (−) images; i.e., representative of different spectral components.

In a preferred embodiment, as shown in FIG. 4, to prevent any 2π phase jumps in the center of the phase map and any consequential phase unwrapping in the central region, a constant phase value C is added to the phase map. This is indicated in FIG. 4 by block 90a between blocks 89 and 91. The constant phase value C is then removed from the phase map after the phase unwrapping, as indicated by block 90b. Alternatively or additionally, a different phase value may be added to different parts of the image, and then preferably removed.

In addition in the preferred embodiment of FIG. 4 a low pass filter is preferably used to filter the output of the unwrapped phase map shown at block 92. The low pass filter is indicated by block 95 appearing after block 92. The output of the filter is the filtered unwrapped phase map 92f.

The filter is recommended (but not required) since the unfiltered unwrapped phase map 92 may have small "spots" (just a few pixels) which still include a 2π phase jump near the phase wrapped line. The "spots" will tend to cause the water and fat to mis-register. Thus the final water image will have some fat spots and the final fat image will have some water spots. Applying the low pass filter removes the spots.

In a preferred embodiment a Fermi filter is used. First, a fast Fourier transform is applied to output of block 92, then, pixel by pixel, the transformed output is multiplied by a two dimensional "Fermi function". The product is subjected to the inverse fast Fourier transform and the Fermi filtered unwrapped phase map of block 92f is obtained.

It should be recognized that even with the filter there is the possibility of error occurring along the phase line after the phase unwrapping. The likelihood of such errors occurring is minimized by the use of the low pass filter but it is not removed. By adding the constant to the phase wrapped map of 89 the central region of the image may be made generally error free. Thus any "spots" will be moved away from the central region of the image. The central region is the main region being examined. Accordingly, if there is some failure causing "spots" that is not taken care of by the filter, the "spots" will preferably be moved to the sides of the images, away from crucial portions of the image.

Figure 5:
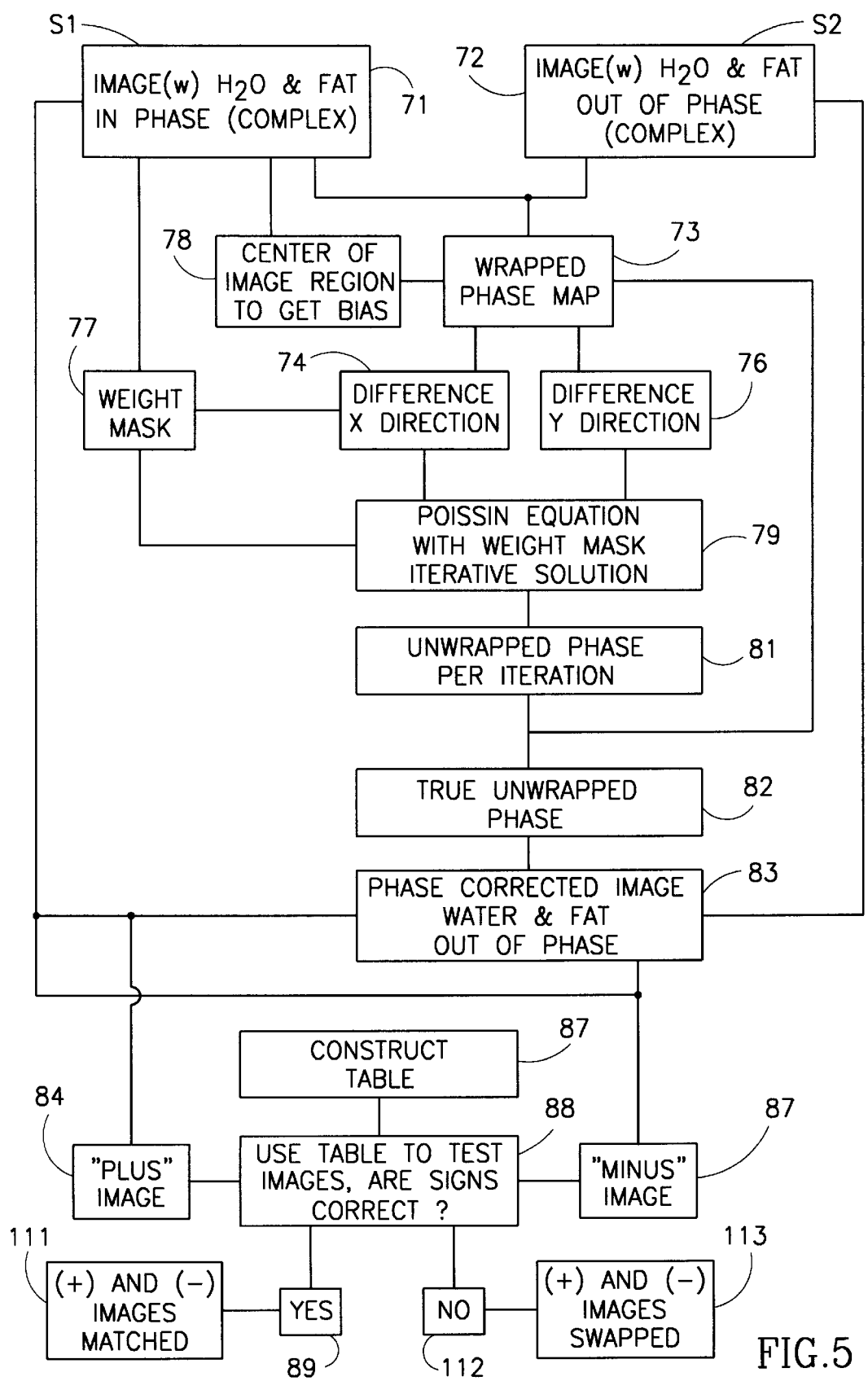
FIG. 5 is a flow chart showing how the first and second spectral images are processed and matched to provide the resultant first and second complex images.

Turning now to the flow diagram of FIG. 5 which broadly shows the generation of a plus image and a minus image and the use of those images to match the same spectral components received from each of the segments of the phased array coil arrangement. The initial in-phase complex image S1 is indicated at block 71. The initial out-of-phase complex image S2 is indicated at block 72. The data from the image S1 and image S2 are combined to obtain a wrapped phase map shown at block 73. The center of the image S1 is examined to determine a constant C as shown at block 78. The constant C is added to this phase map block 73 to make the center region of this phase map zero. Alternatively or additionally, the other regions of the phase map may be set to zero or a different value, by selection of an appropriate value for constant C. The wrapped phase differences are obtained from block 73 both in the X direction (columns) as shown by block 74 and in the Y direction (rows) as shown by block 76. The noise information of the image S1 is used to provide a weight mask shown at block 77.

More particularly in a preferred embodiment the weight mask is provided using the following: The average noise level of the image is computed. A threshold is determined. Three to five times the average noise level is preferably used as a threshold. When the water and fat are in phase as in image S1, then pixels having intensity levels greater than the threshold are given a value of one in the weight-mask. All other pixels have a "0" value. Preferably, the weight mask pixels are also of zero value if the pixel to pixel difference either in the X or in the Y direction is greater than another threshold which is determined by the maximum Bo inhomogeneity. In the exemplary system this threshold is set to be 0.6 to 1.5 radians based on a maximum Bo inhomogeneity of 30–75 ppm across the image.

The intensity and phase information from the weight mask are preferably combined to set up and iteratively solve the Poisson equation as shown at block 79. The solution of the Poisson equation provides the unwrapped phase map. However this unwrapped phase map is biased by a constant. To get the true unwrapped phase the bias is preferably removed by adding a constant to this phase map to make the center region of this phase map zero. Then the constant C added previously is subtracted to make the center region of the wrapped phase map zero.

The solution of the Poisson equation provides an unwrapped phase per iteration as shown at block 81. Iterations are continued until a true unwrapped phase is provided as shown in block 82. The true unwrapped phase map is obtained using the difference of the two phase maps. The true unwrapped phase map is used to correct the phase, pixel-by-pixel in the image S2 to provide a phase corrected image S3 shown at 83 with first and second spectral components out of phase.

The phase unwrapping procedures may introduce a factor of 2(2n−1)π (where n is an integer) to the unwrapped phase map. If a factor 2 (2n−1) π is introduced to the unwrapped phase map, the resultant images must be "exchanged". For example, if the unwrapping procedures for the first segment of the phased array coil arrangement do not introduce a $2(2n-1)\pi$ factor to the unwrapped phase map, but the unwrapping procedures for the second segment of the coil arrangement in the same slice do introduce a $2(2n-1)\pi$ factor to the unwrapped phase map; then the separate "plus" image from segment 1 will have to be combined with the separate "minus" image of segment 2 and the "minus" image from segment 2 will have to be combined with the "plus" image of segment 1 respectively. If a $4n\pi$ factor is introduced to the unwrapped phase map, there is no exchange of the plus and the minus image.

Clinically, where a plurality of slices are being imaged it also may be required to group the water images and fat images from all of the slices together. In clinical scans, the slice thickness is usually 1–10 mm and the gaps between slices are usually less than the slice thickness. Therefore, it can be assumed that the distance from one slice to the next is on the order of 1 cm. Since the main field changes very slowly, the average pixel value of the unwrapped phase map from one slice to the next should change a very small amount. Therefore, if the average value of the unwrapped phase map from one slice of one segment has a $+2\pi$ difference from that of the next slice, the plus image and the minus image from that next slice of the same segment should be swapped. If the difference is 0 or $+4\pi$, there is no swap of the water and fat images.

Due to the noise and the distance between the slices the difference of the averages of the criteria cannot be an exact $0, +2\pi, +4\pi, \ldots$ Some tolerance value is used. In a preferred system, the tolerance value is set to $\pi$. If the difference is between $\pi$ to $3\pi$, or between $-3\pi$ to $-\pi$, the plus and the minus images are swapped.

According to the above discussion, a pair of two dimensional tables are prepared for grouping the plus and minus images. Each compartment or cell of each of the tables has two indices, a slice index (i) and a segment index (j). In Table I, the value of the cell Vij, with the slice index i and the segment index j, represents the average value of the unwrapped phase map, multiplied pixel by pixel with the weight mask generated from the slice i and the segment j.

In Table II, the value of each cell Sij has a value of either $+1$ or $-1$. For the first slice and the first segment, the water and the fat are arbitrarily assigned values, i.e. the "plus" image is assigned as the "water" image and the "minus" image is assigned as the "fat" image. The cell 11 of Table II is set to be $+1$.

Then any segment and the first slice (that is V1j) is compared with V11. If the difference between them is between $\pi$ to $3\pi$, or between $-3\pi$ to $-\pi$, then S1j is set to $-1$. Otherwise, S1j is set to $+1$. In general for the first segment and the i slice, Vi1 is compared with V(i–1),1. If the difference between them is between $\pi$ to $3\pi$ or $-3\pi$ to $-\pi$, Si1 is set to S(i–1),1 times $-1$. Otherwise, Si1 is set to S(i–1),1. Thus, for any j segment and i slice Vij is compared to Vi1 and if the difference between them is between either $+(\pi$ to $3\pi)$; Sij is set to Si1 times $-1$. Otherwise Si1 is kept at Si1. After all cells in Table II are set, the "plus" image and the "minus" image from the i slice and the j segment are "swapped" if the corresponding S1j=$-1$. After exchanging all "plus" images from the different segments of the i slice; the plus images are added together as the "water" image for the i slice and all the "minus" images from the different segments of the i slice are added together as the "fat" image for the i slice.

For example:

TABLE I

| Slice | 1 | 2 | 3 |
|---|---|---|---|
| Segment | | | |
| 1 | $V_{11} = 2.1$ | $V_{21} = 2.0$ | $V_{31} = 8.4$ |
| 2 | $V_{12} = 2.3$ | $V_{22} = 2.1$ | $V_{32} = 8.3$ |
| 3 | $V_{13} = 1.9$ | $V_{23} = 4.3$ | $V_{33} = 8.1$ |
| 4 | $V_{14} = 8.4$ | $V_{24} = 2.2$ | $V_{34} = 8.2$ |

TABLE II

| Slice | 1 | 2 | 3 |
|---|---|---|---|
| Segment | | | |
| 1 | $S_{11} = 1$ | $S_{21} = 1$ | $S_{31} = -1$ |
| 2 | $S_{12} = 1$ | $S_{22} = 1$ | $S_{32} = -1$ |
| 3 | $S_{13} = 1$ | $S_{23} = 1$ | $S_{33} = -1$ |
| 4 | $S_{14} = -1$ | $S_{24} = 1$ | $S_{34} = -1$ |

The slices are the location in the image of the object. In this example, there are a total of 3 slices and each slice was imaged with a phased array coil arrangement with four segments.

Now for slice #1, there is the set: $S_{11}=1$, $S_{12}=1$, $S_{13}=1$, $S_{14}=-1$. The "plus" image and the "minus" image from the segment #4 are exchanged; i.e. the "plus" images from segments #1, #2 and #3 and the "minus" image from segment #4 are summed. The "minus" images from segments #1, #2 and #3 and the "plus" image from segment #4 are summed.

For the slice #2, the sign of cell $S_{21}$ is decided by comparing $V_{21}$ and $V_{11}$. If the difference is 0 or $\pm 4\pi$, then $S_{21}=1$. If the difference is $\pm 2\pi$, then $S_{21}$ is set to $-S_{11}$. A comparison is made of $V_{22}$ with $V_{21}$. If the difference is 0 or $\pm 4\pi$, $S_{22}$ is set to $S_{21}$. If the difference is $\pm 2\pi$, $S_{22}$ is set to $-S_{21}$. Then $S_{23}$ is compared with $S_{21}$ and $S_{24}$ is compared with $S_{21}$. If the difference is $\pm 2\pi$, then set $S_{23}$ (or $S_{24}$) to $-S_{21}$. If the difference is 0 or $\pm 4\pi$, set $S_{23}$ (or $S_{24}$) to $S_{21}$.

For slice #3, the sign of the cell $S_{31}$ is decided by comparing $V_{31}$ with $V_{21}$. If the difference is 0 or $\pm 4\pi$, $S_{31}$ is set to $S_{21}$. If the difference is $\pm 2\pi$, $S_{31}$ is set to $-S_{21}$. Then $V_{32}$ is compared with $V_{31}$, $V_{33}$ with $V_{31}$, and $V_{34}$ with $V_{31}$. With the same principle, we can decide $S_{32}$, $S_{33}$ and $S_{34}$.

From Table II, any cell with a $-1$ value, determines that the corresponding "plus" image and "minus" image should be exchanged before summations.

The individual segments in the phased array coil are preferably of the same type (linear or quadrature) and most or all individual segments preferably have a significant overlap in the slice (each contributes significantly to the overall image). This is usually the case for body, pelvic and shoulder phased array coils.

What is called the plus image 84 is obtained by adding image S1 and the phase corrected image S3 of block 83. The minus image 87 is obtained by subtracting the S3 image from the 54 image. Now what must be done is to determine if what has been found to ostensibly be the minus images is indeed a minus image and what has been found to ostensibly be the plus image is indeed a plus image. If it is found that a plus or a minus image is not truly a plus or a minus image then its sign is changed, sometimes referred to herein as "exchanged". After the signs are changed then the images are matched and combined to provide the true fat and water images, for example.

More particularly the test of the signs "plus" or "minus" is shown in FIG. 5. As shown therein block 87 indicates that a table is constructed. Block 88 indicates that the "plus" image and the "minus" image are tested using the tables to see whether or not the indicated signs are correct. If the signs are correct as indicated by block 89 then the image 84 is matched with the other images having positive signs as indicated at block 111. Similarly if the signs are correct then the image 87 is matched with other images having negative signs as also indicated at block 111.

If the tests show that either of the images 84 or 87 do not have the correct sign as indicated at block 112 then basically the sign is changed and a positive image is treated as a negative image and matched with the negative images and vice versa as indicated at block 113.

While the invention is described using specific examples, it should be understood that these examples are not to be construed as limitations on the scope of the invention which is defined by the claims that follow.

What is claimed is:

1. A method of using magnetic resonance imaging (MRI) systems for acquiring separate data contributions in images of subjects derived from at least a first and a second spectral components, the method comprising:
   applying RF pulses;
   receiving RF signals with a phased array coil arrangement having a plurality of segments;
   acquiring two initial complex images, the first of the two initial images being a complex image of each of the spectral components in phase; the second of the two initial images being a complex image of each of the spectral components out of phase, the first of said two initial complex images ostensibly being a plus image, and the second of said two complex images ostensibly being a minus image initially; and
   matching the ostensible plus and minus images so that the first complex images and the second complex images are grouped together for further processing.

2. The method of claim 1 wherein further processing includes determining whether the ostensible plus and minus images are truly plus or minus images.

3. The method of claim 1 including:
   processing the images of the subjects to obtain a wrapped phase map and an unwrapped phase map;
   adding a phase value C to the wrapped phase map; and
   subtracting the phase value C from the unwrapped phase map, to assure that at least a portion of the image will be free of errors.

4. The method of claim 3, wherein said portion comprises a center of the image.

5. The method of claim 3, wherein said phase value is a same value for the entire phase map.

6. The method of claim 3 including applying a low pass filter to the unwrapped phase map to remove possible error "spots" along phase jump lines.

7. The method of claim 1, wherein said phase array coil comprises at least four segments.

8. The method of claim 1, wherein said phase array coil comprises at least six segments.

9. The method of claim 1, wherein said spectral component images are acquired using a Dixon method.

10. A method of using magnetic resonance imaging (MRI) systems for acquiring separate data contributions in images derived from at least first and second spectral components, the method comprising:
    using a phased array coil for detecting signals from said MRI systems;
    said phased array coil comprising a plurality of coil segments, each of said segments acquiring signals from a patient being imaged;
    acquiring at least two initial complex images per segment using said phased array coil, the first of said two initial complex images including said at least first and second spectral components in-phase, the second of said two complex images including said at least two first and second spectral components out of phase; and
    using the in-phase and the out-of-phase images to identify an image of the first spectral component and an image of the second spectral component.

11. The method of claim 10 including:
    generating a wrapped phase map from said two initial complex images; and
    unwrapping the wrapped phase map.

12. The method of claim 11 wherein unwrapping the wrapped phase map comprises:
    solving a Poisson equation with a weighting map to derive an unwrapped phase map;
    using the unwrapped phase map to correct the phase of the out-of-phase image of spectral components;
    using the image with the corrected phase to obtain a plus image and a minus image; and
    determining whether the plus image and the minus image are truly plus and minus images.

13. The method of claim 10 wherein the first spectral component is water and the second spectral component is a lipid.

14. The method of claim 12 wherein the unwrapped phase map includes a bias for all of the pixels, comprising:
    removing the bias to obtain a true unwrapped phase map; and
    using said true unwrapped phase map to correct the phase of the out-of-phase complex image.

15. The method of claim 14 wherein removing the bias comprises:
    determining the bias per pixel; and
    using the determined bias to remove the bias from the unwrapped phase map.

16. A method of using magnetic resonance imaging (MRI) systems having phased array coils made up of a plurality of segments for acquiring separate data contribution in images of subjects derived from at least a first and second spectral components, the method comprising:
    applying RF pulses to a subject using said MRI system;
    receiving RF signals from said first and second spectral components, in each segment of the phased array coil arrangement;
    processing said received RF signals to provide two initial complex images; the first of said two initial complex images ostensibly being a plus image;
    processing said two initial complex images to provide a first processed complex image that is ostensibly a plus image and a second processed complex image that is ostensibly a minus image;
    matching the ostensibly plus and ostensibly minus images; and
    grouping the plus and minus image of each of the spectral components for further processing to provide resultant complex images of each of the spectral components.

17. The method of claim 16, wherein said spectral components are acquired using a two point Dixon method.

18. A magnetic resonance imaging system for acquiring and accumulating separate data contributions for images derived from first and second spectral components, the system comprising of:
- a coil used in applying RF pulses;
- a phased array coil arrangement comprising a plurality of segments for receiving RF signals;
- each segment of the phased array coil acquiring data for two initial complex images;
- analog to digital converters converting the data acquired to digital data;
- image processors using the digital data to provide ostensibly plus and minus images;
- a spectral component processor determining and combining the real plus and real minus images to provide a resultant complex image for each of the spectral components; and
- a display for displaying the resultant complex images.

19. The system of claim 18 wherein an echo scan sequence is used for performing a two point Dixon method for acquiring said data, said two point Dixon method comprising:
- shifting the 180° pulse and the corresponding slice selective gradient of the echo scan sequence by an amount sufficient to assure that the first and second spectral components in-phase in a first scan, applying the 90° RF pulse and the 180° RF pulse in a second scan so that the spectral components are 180° out-of-phase; and
- providing two initial spectral complex images S1 and S2, wherein in S1 the spectral components are in-phase and in S2 the spectral components are out-of-phase.

20. The system of claim 19, comprising image processors per segment providing ostensible plus and minus complex images and, tables for testing the images to determine whether they are indeed plus or minus images.

21. The system of claim 20 including a circuit for adding a constant value for preventing any 360° phase jumps in the center of an unwrapped phase map that is obtained after phase unwrapping.

22. The system of claim 21 including a circuit removing a constant value from the unwrapped phase map.

23. The system of claim 22 including a low pass filter used to filter the output of the unwrapped phase map.

24. The system of claim 23 where the filter comprises a Fermi filter.

25. The system of claim 24 wherein the spectral component processor determines the average noise level of the in-phase image to provide a weight mask using the average noise level as a threshold.

26. The system of claim 25 wherein the threshold is between 3 and 5 times the average noise level, wherein the in-phase image pixels having intensities level greater than the threshold are given a value of 1, all other pixels have a 0 value, and giving the pixels of the weight noise a 0 value mask if the pixel to pixel difference either in the X or in the Y direction is greater than a second threshold determined by the maximum BO in homogeneity.

27. The system of claim 26 including determining if the phase unwrapping procedure has introduced the factor of $2(2n-1)\pi$ to the unwrapped phase map where n is an integer and exchanging the sign of the resulting images if there is a $2(2n-1)\pi$ factor introduced to the unwrapped phase map.

* * * * *